(12) United States Patent  
Nagata et al.

(10) Patent No.: US 7,646,052 B2  
(45) Date of Patent: Jan. 12, 2010

(54) DRAM AND SRAM MIXEDLY MOUNTED SEMICONDUCTOR DEVICE

(75) Inventors: Takami Nagata, Kanagawa (JP); Masaru Ushiroda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 88 days.

(21) Appl. No.: 11/867,198

(22) Filed: Oct. 4, 2007

(65) Prior Publication Data

US 2008/0099812 A1    May 1, 2008

(51) Int. Cl.
  H01L 21/336   (2006.01)
  H01L 21/8234  (2006.01)
  H01L 21/8238  (2006.01)

(52) U.S. Cl. .............. 257/298; 257/296; 257/297; 257/300; 257/903; 257/E21.648; 257/E21.66; 257/E27.081; 438/197; 438/199

(58) Field of Classification Search .......... 257/E21.616, 257/E21.614, E21.615, E21.627, E21.646, 257/E21.661, E21.647, E27.084, E21.66, 257/71, 67, 66, 68, 296, 297, 298, 300, 903, 257/E21.645, E21.648–E21.649, E27.08, 257/E27.103, E27.086, E21.681; 438/197, 438/199

See application file for complete search history.

(56) References Cited

U.S. PATENT DOCUMENTS

2004/0259306 A1*  12/2004  Sakai et al. ............. 438/241

FOREIGN PATENT DOCUMENTS

JP    2005-56993 A    3/2005

OTHER PUBLICATIONS

Arai et al., A0.13μm Full Metal Embedded DRAM Technology Targeting on 1.2 V, 450 MHz Operation, 2001 IEEE.
Yoshimura et al., A COMS Technology Platform for 0.13μm Generation SOC (System on a Chip) IEEE, 2000 Symposium on VLSI Technology Digest of Technical Papers p. 144-145.

* cited by examiner

Primary Examiner—A. Sefer
Assistant Examiner—Ermias Woldegeorgis
(74) Attorney, Agent, or Firm—Sughrue Mion, PLLC

(57) ABSTRACT

A semiconductor device in which a DRAM and a SRAM are mixedly mounted is provided. The DRAM and the SRAM have a stack-type structure in which a bitline is formed below a capacitive element. A cross couple connection of the SRAM is formed in a layer or below the layer in which a capacitive lower electrode of the DRAM is formed and in a layer or above the layer in which the bitline is formed. For example, the cross couple connection of the SRAM is formed in a same layer as a capacitive contact.

16 Claims, 13 Drawing Sheets

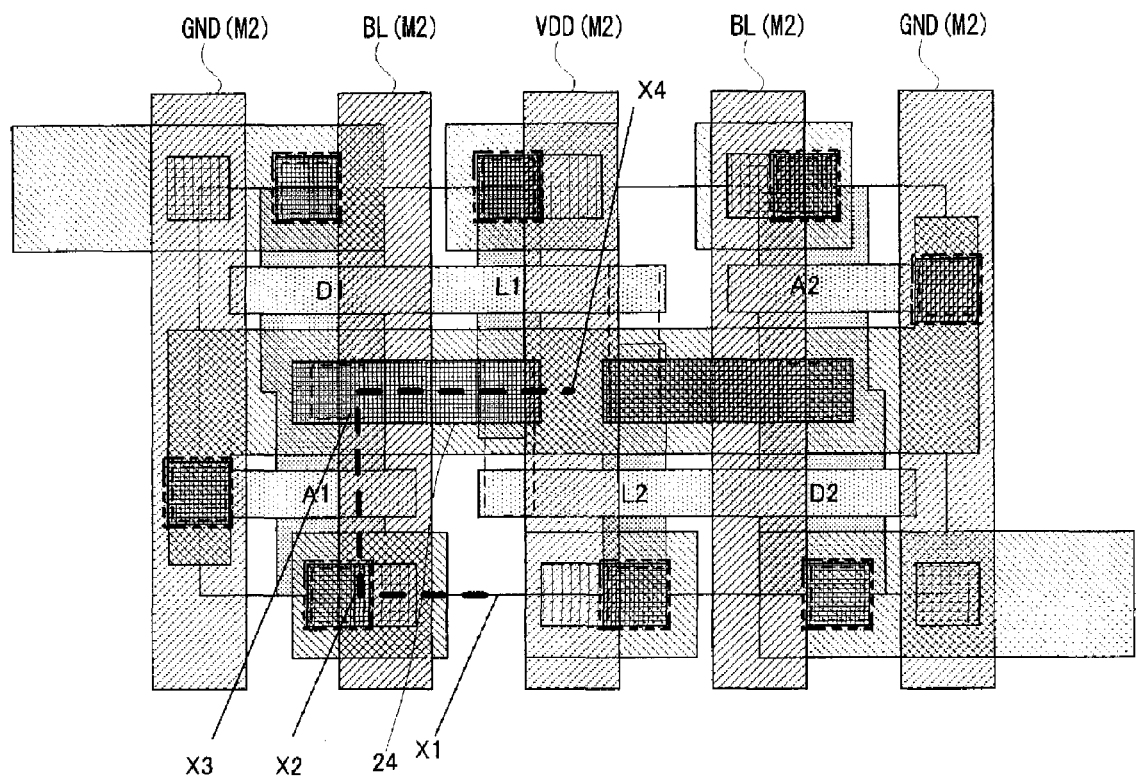
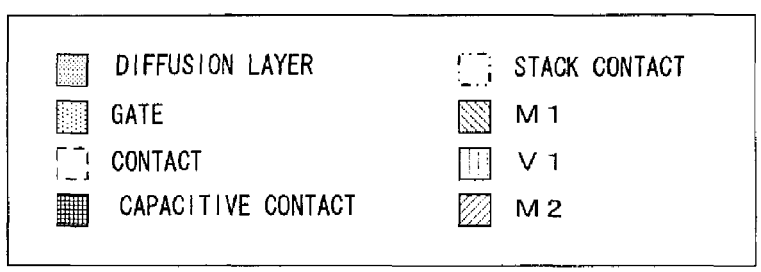
Fig. 2

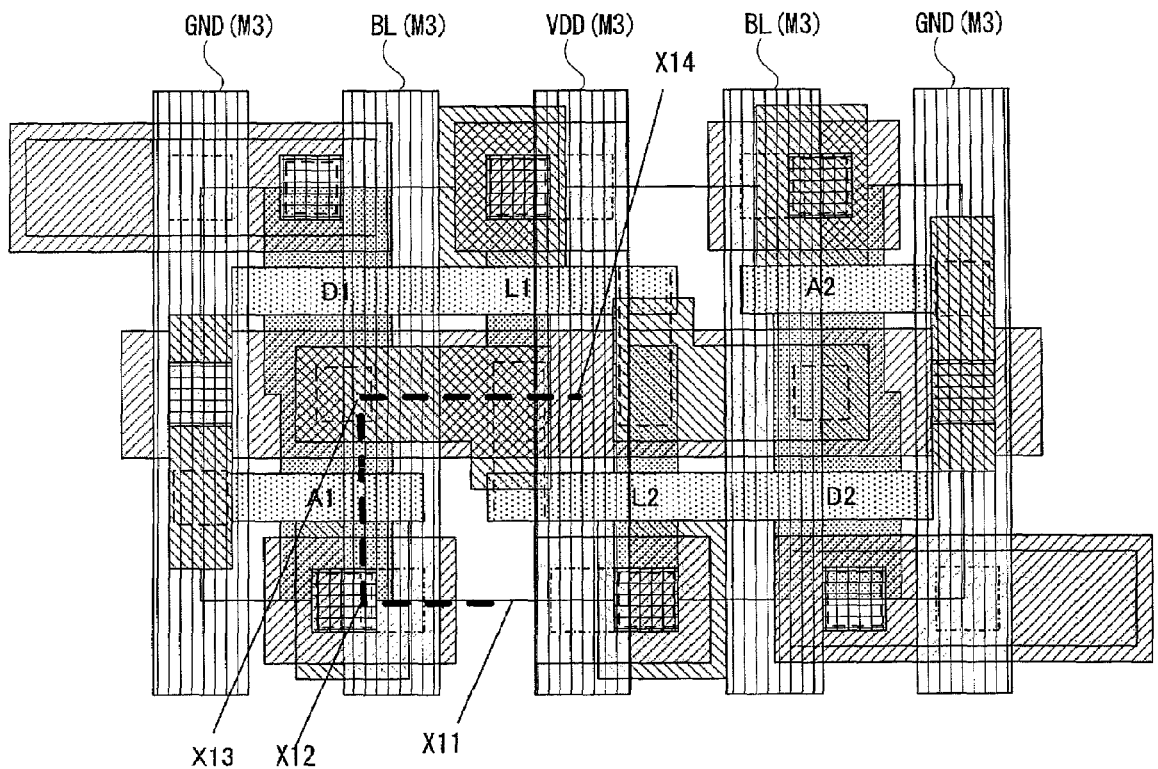
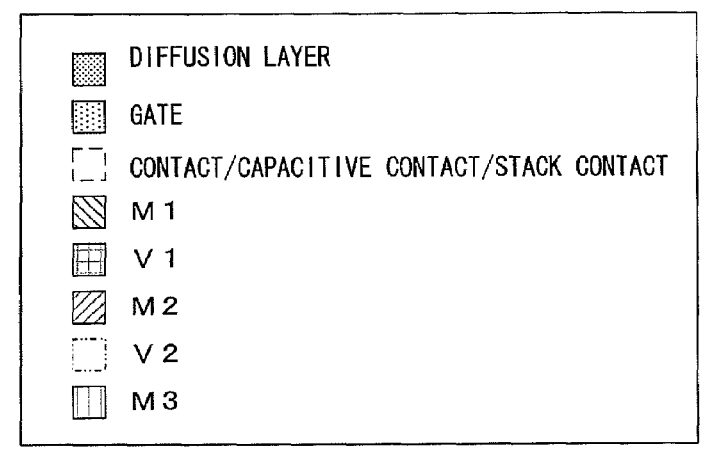
Fig. 9
PRIOR ART

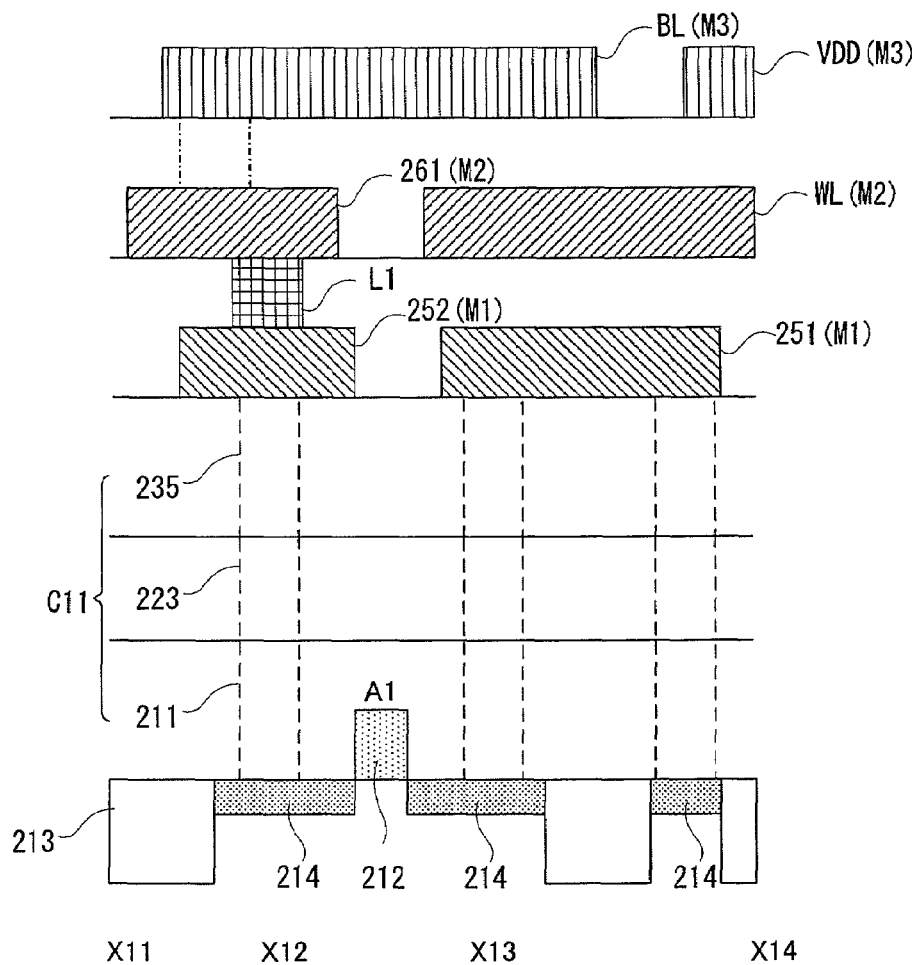
PRIOR ART   Fig. 10A
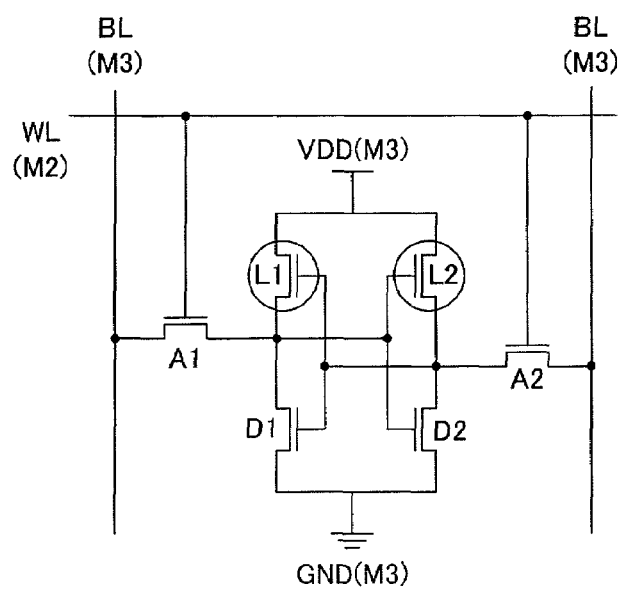
PRIOR ART   Fig. 10B

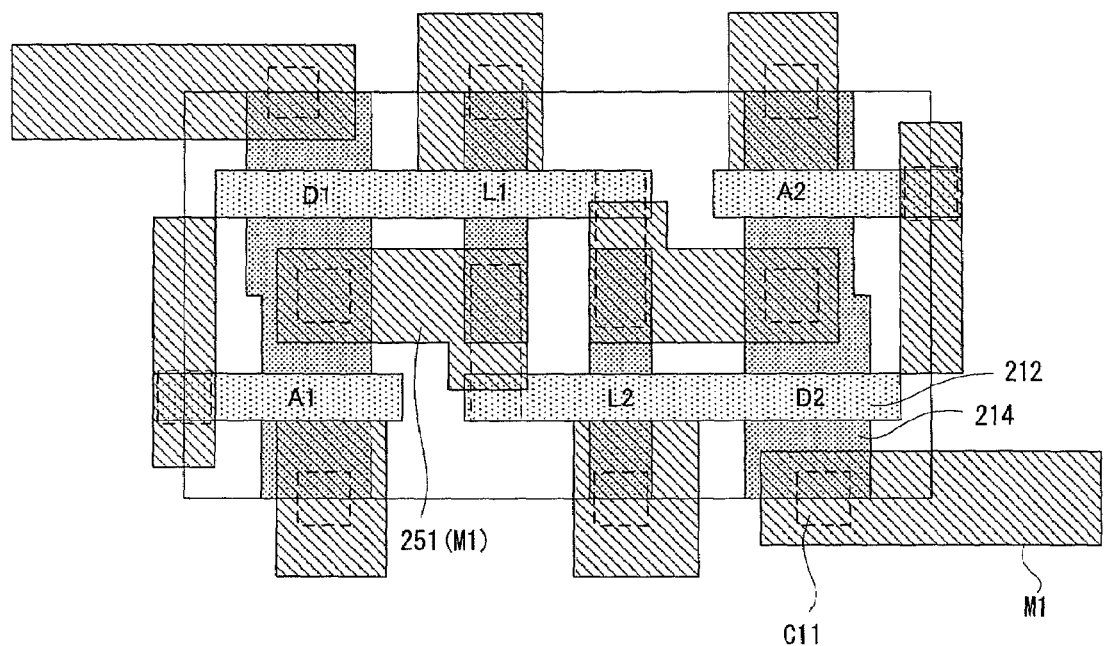
PRIOR ART    Fig. 13A
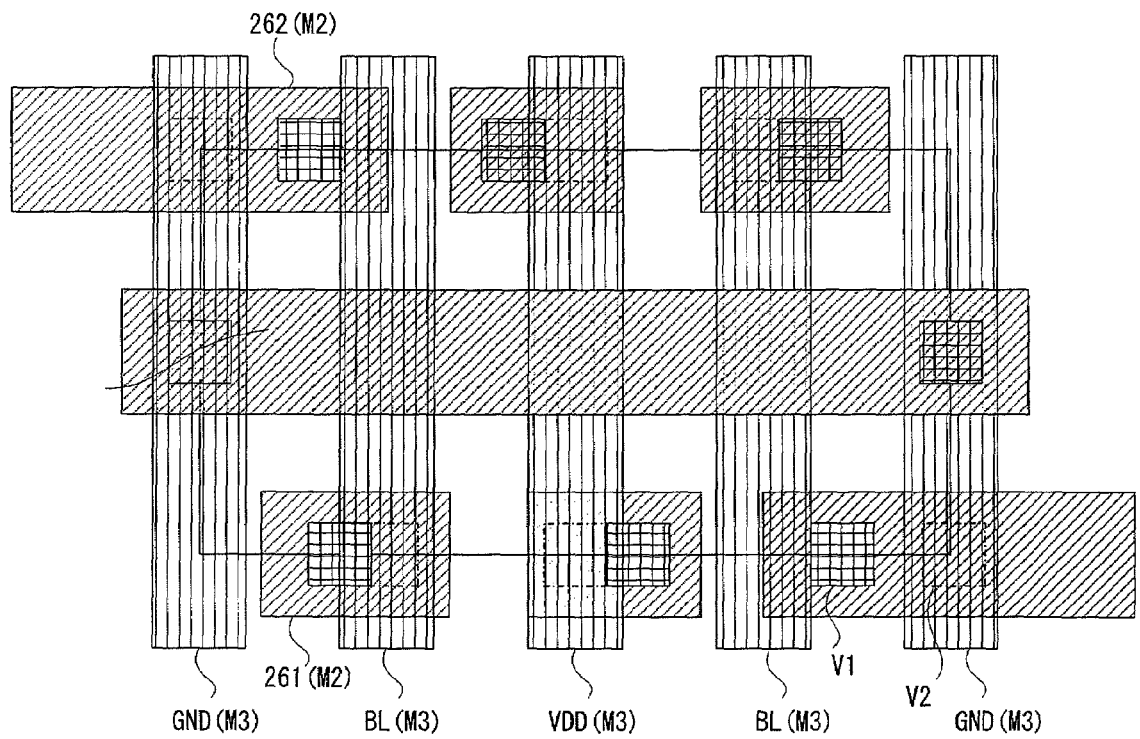
PRIOR ART    Fig. 13B

DRAM AND SRAM MIXEDLY MOUNTED SEMICONDUCTOR DEVICE

BACKGROUND OF THE INVENTION

1. Field of the invention

The present invention relates to a semiconductor device in which a DRAM, a SRAM, and a logic circuit are mixedly mounted.

2. Description of Related Art

In a conventional function wiring of a SRAM, three wiring layers are used (see Japanese Unexamined Patent Application Publication No. 2005-56993 (Harada), for example). As shown in FIG. 7, a semiconductor device disclosed in Harada includes a product integrated circuit having a desired function, and a first SRAM circuit 112 and a second SRAM circuit 113 used for a process failure analysis. The first SRAM circuit 112 includes a SRAM cell of a C-MOS structure and realizes a SRAM function with a wiring formed of a first wiring layer M1 to a third wiring layer M3, vias (1 Via and 2 Via), and a contact CO, all of which are formed on the SRAM cell. Note that another wiring that has no direct relation with the SRAM function is arranged in a fourth wiring layer M4 to a sixth wiring layer M6 of the first SRAM circuit 112. A wiring connecting between transistors of the SRAM cell (cross couple connection) is formed in the first wiring layer M1. A wordline is formed in the second wiring layer M2. A digit (bit) line is formed in the third wiring layer M3.

The second SRAM circuit 113 also includes the SRAM cell of the C-MOS structure as the first SRAM circuit 112 does. And the second SRAM circuit 113 realizes the SRAM function with a wiring formed of the fourth wiring layer M4 to the sixth wiring layer M6, and vias (3 Via to 5 Via), all of which are formed above the SRAM cell. A vertical via and a dotted wiring are formed in the first wiring layer M1 to the third wiring layer M3, the vias (1 Via, 2 Via), and the contact CO of the second SRAM circuit 113. The vertical via and the dotted wiring causes the wiring having the SRAM function composed of the the first wiring layer M1 to the third wiring layer M3, the vias (1 Via, 2 Via), and the contact CO in the first SRAM circuit 112 to be arranged in the fourth wiring layer M4 to the sixth wiring layer M6 and the vias (3 Via to 5 Via). In the second SRAM circuit 113, a wiring connecting between the transistors of the SRAM cell (cross couple connection) is formed in the fourth wiring layer M4, the wordline is formed in the fifth wiring layer M5, and the digit line is formed in the sixth wiring layer M6, for example.

In the failure analysis of a semiconductor 110, a bitmap analysis that is applied to the failure analysis of memory products is applied to the first SRAM circuit 112 and the second SRAM circuit 113. In general, the SRAM circuit has three wiring layers. Therefore, it is possible to identify which wiring layer of the three wiring layers that forms the SRAM function has a failure by applying the bitmap analysis to the SRAM circuit.

As stated above, the SRAM circuit typically has three wiring layers. Therefore, in a logic process in which the DRAM is mixedly mounted, a process for forming a bitline and a capacity is added between a process for forming a contact of a general logic process and a process for forming the first wiring layer (M1) in the DRAM region. And in the region other than the DRAM region, a three-tiered structure in which a capacitive contact and a stack contact are mounted on the contact of a logic is built to connect to the first wiring layer M1 (see S. Arai et al., A0. 13 μm Full Metal Embedded DRAM Technology Targeting on 1.2 V, 450 MHz Operation, IEEE, 2001, for example). The DRAM is classified into two types, a stack type and a trench type, in terms of a structure of a capacitor (see H. Yoshimura et al., ACMOS Technology Platform for 0.13 μm Generation SOC (System on a Chip) IEEE, 2000 Symposium on VLSI Technology Digest Papers p. 144-145, for example). Note that the stack-type DRAM is explained here.

FIGS. 8 to 11 are diagrams showing a related semiconductor device in which the DRAM is mixedly mounted. FIG. 8 is a schematical cross sectional view and FIG. 9 is a plan view of the SRAM region. FIG. 10A is a cross sectional view showing X1 to X14 shown in FIG. 9, and FIG. 10B is a view of an equivalent circuit. FIG. 11A is a plan view of the first wiring layer and a layer below the first wiring layer, and FIG. 11B is a plan view of the layer above the first wiring layer.

A semiconductor substrate includes a DRAM region A11, a logic region A12, and a SRAM region A13. The logic region A12 is a region in which a sense amplifier other than a memory is formed, for example. In addition, a transistor and a capacitive element are formed using the substrate and the first to fourth interlayer insulating layers 210, 220, 230, 240 formed on the substrate, and the three wiring layers M1 to M3 are formed on the upper layer. A diffusion layer 214 that is a source and a drain and a isolation field oxide 213 are formed below the first interlayer insulating layer 210 as shown in FIG. 10A. A gate electrode 212 is formed above the diffusion layer 214 and the like. As shown in FIG. 8, contacts 211, 223, 235 (see contact C11 in FIG. 10A) connecting the diffusion layer 214 and the first wiring layer M1 are formed to penetrate through the first to fourth interlayer insulating layers, 210, 220, 230, and 240.

In the DRAM region All, the third interlayer insulating layer 230 and the fourth interlayer insulating layer 240 are provided to form a capacitive element 231 formed of a lower electrode 232, a dielectric film 233, and an upper electrode 234. On the other hand, in the SRAM region, a stack contact 235 is provided penetrating through the third interlayer insulating layer 230 and the fourth interlayer insulating layer 240. As will be clear, the contacts connected to each diffusion layer or to the gate have the three-tiered structure in the SRAM region A13.

As shown in FIGS. 10A and 10B, the first wiring layer M1 includes a wiring 251 (M1) and a connection wiring (relay pad) 252. The wiring 251 (M1) connects the transistors D1 and L1 and is formed in the first wiring layer M1. The connection wiring (relay pad) 252 connects the contact C11 and the via V1 and is formed in the first wiring layer M1. The second wiring layer M2 is formed on the first wiring layer M1 through the via V1. As shown in FIGS. 10A and 10B, the second wiring layer M2 has a wordline WL (M2) and a relay pad 261 (M2) connecting the vias V1 and V2. In addition, the third wiring layer M3 is formed on the second wiring layer M2 through the via V2. The third wiring layer M3 includes a bit line BL (M3) and a power supply line VDD (M3).

As shown in FIGS. 12 and 13, the wordline WL of the second wiring layer may be linearly formed depending on layouts of the wiring layers M1 to M3.

However, in the related SRAM, the cross couple connection is formed using the first wiring layer M1, and the diffusion layer and the first wiring layer M1 used to connect nodes are connected by the contacts built in the three-tiered structure (C11). Then the wiring layer such as the wordline is provided on the first wiring layer M1. Therefore, all the wiring layers from the first to third wiring layers, M1 to M3, are needed to form the SRAM cell. Moreover, the wiring M3 for inter-macro connection cannot be provided in the SRAM cell region because the third wiring layer M3 is needed to form the SRAM cell. Therefore, there are problems that a wiring delay can be occurred and a chip size can be increased because it is needed to perform wiring by bypassing the SPAM cell region when the inter-macro connection is performed in the third wiring layer M3.

SUMMARY

According to the present invention, there is provided a S semiconductor device comprises a DRAM cell formed on a substrate, said DRAM cell having a transistor connecting to a bit line and capacitor having a lower electrode, a dielectric film and an upper electrode, and a SRAM cell formed on the substrate, said SRAM cell having a cross couple connection, wherein said cross couple connection comprises a layer formed between said dielectric film and a layer of a plug which connects the bitline.

According to the present invention, there is provided another semiconductor device in which a DRAM and a SRAM are mixedly mounted comprises a transistor formed in a DRAM area, a capacitive contact and a bitline connected to the transistor, a capacitive element connected to the capacitive contact, a first load transistor and a first drive transistor connected between a power supply and a ground supply formed in a SRAM area, a second load transistor and a second drive transistor connected between the power supply and the ground supply formed in the SRAM area, a first cross couple connection connecting between diffusion layers of the first load transistor and the first drive transistor formed in a same layer as that of one of the capacitive contact, bitline, and capacitive element, and a second cross couple connection connecting between diffusion layers of the second load transistor and the second drive transistor formed in a same layer as that of one of the capacitive contact, bitline, and capacitive element.

According to the present invention, there is provided another semiconductor device comprises a substrate having a first region, a second region and a third region, DRAM formed on the first regin, SRAM formed on the second region, and a logic formed on the third region, wherein said DRAM and said logic having a first wiring layer which comprises a lowest metal layer, a first insulating layer formed on the first wiring layer, a second wiring layer formed on the first insulating layer, a second insulating layer formed on the second wiring layer, and a third wiring layer formed on the second insulating layer, wherein said third wiring layer is formed across the second region, and said third wiring layer is upper than a most upper layer of the SRAM.

In the present invention, the cross couple connection of the SRAM is formed in a bitline layer of the DRAM or in a lower electrode layer of the capacitive element. Therefore, there is no need to form the cross couple connection in a wiring layer formed above the capacitive element. According to the present invention, it is possible to provide the semiconductor device in which a number of the wiring layer that is needed for the SRAM cell can be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a plan view showing a layout of a SRAM region of the semiconductor device according to the embodiment of the present invention;

FIG. 9 is a plan view showing a SRAM region in the conventional semiconductor device in which the DRAM is mixedly mounted;

FIG. 10A is a cross sectional view showing X11 to X14 shown in FIG. 9;

FIG. 10B is an equivalent circuit diagram;

FIG. 13A is a diagram showing another conventional SRAM region and a plan view of the first wiring layer and the layer below the first wiring layer shown in FIG. 11; and FIG. 13B is a diagram showing another conventional SRAM region and a plan view of the layer above the first wiring layer shown in FIG. 11.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A specific embodiment to which the present invention is applied will now be described in detail below with reference to the drawings. This embodiment is the one in which the present invention is applied to a semiconductor device in which a DRAM and a SRAM are mixedly mounted.

Figure 1:
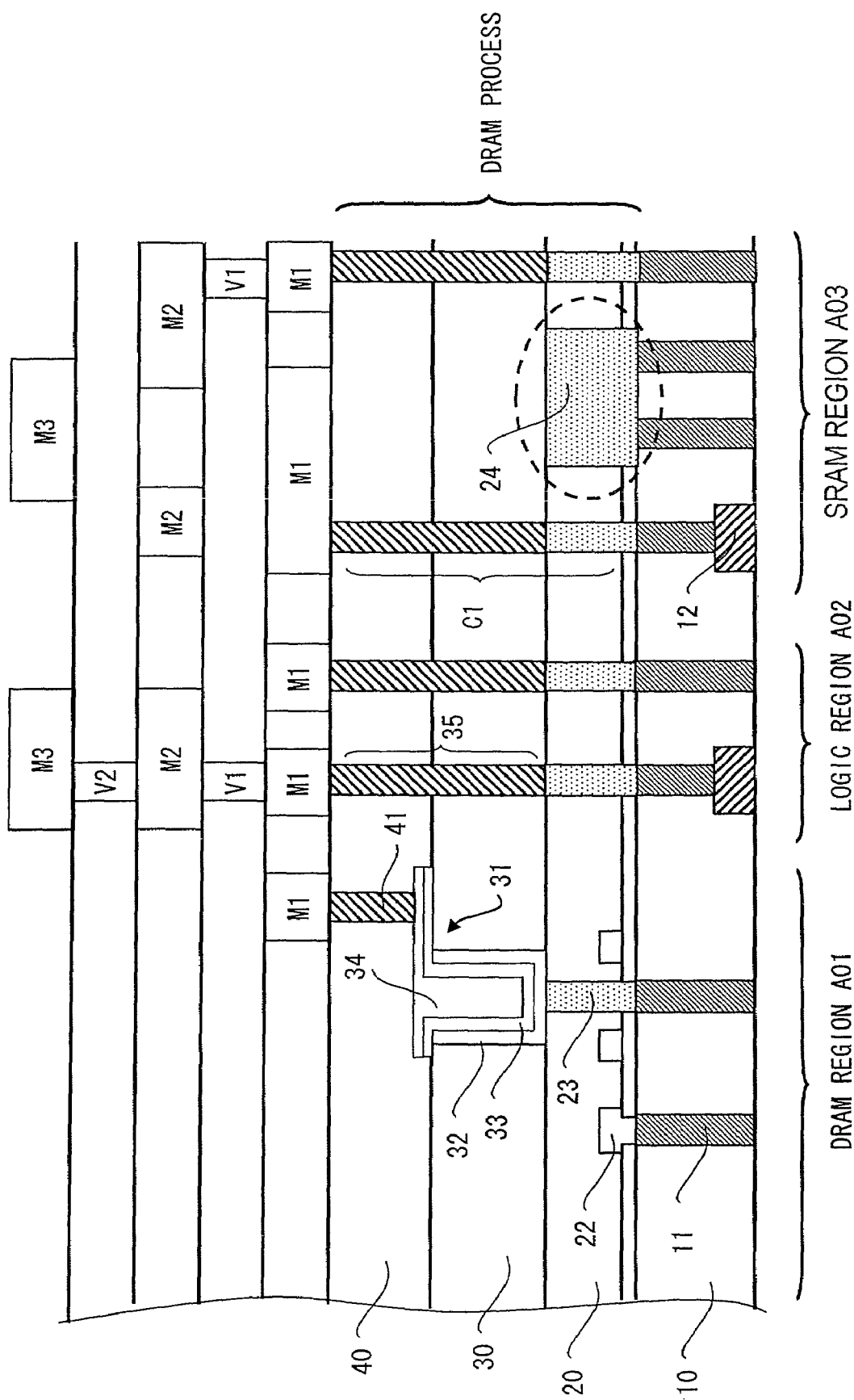
FIG. 1 is a cross sectional view schematically showing a semiconductor device according to an embodiment of the present invention.

FIG. 1 is a cross sectional view schematically showing the semiconductor device according to the embodiment. As shown in FIG. 1, a semiconductor device 1 according to the embodiment includes a DRAM region A01, a logic region A02, and a SRAM region A03. A memory transistor and a capacitive element are formed in the DRAM region A01 and the memory transistor is formed in the SRAM region A03. The logic region A02 is provided between the DRAM region A01 and the SRAM region A03. A logic circuit such as a sense amplifier other than a memory is formed in the logic region A02.

The DRAM is classified into two types, a stack type and a trench type, in terms of a structure of a capacitor. The DRAM according to the embodiment is the stack type, and has a COB (Capacitor over Bitline) structure in which the capacitor is formed above a bitline. More specifically, the DRAM according to the embodiment has a bitline 22 connected to a contact 11 formed in a first interlayer insulating layer 10 and a capacitive element 31 connected to a capacitive contact 23 formed in a second interlayer insulating layer 20. The capacitive element 31 has a lower electrode 32, a dielectric film 33, and an upper electrode 34, and is formed in a third interlayer insulating layer 30. The capacitive element 31 is connected to a first wiring layer M1 through a stack contact 41.

In the logic region A02 and the SRAM region A03, a gate electrode 12 and the like is formed in the first interlayer insulating layer 10 or a diffusion layer is formed in the layer below the first interlayer insulating layer 10. And the gate electrode or the diffusion layer and the first wiring layer M1 are connected through a contact C1. The contact C1 has a three-tiered structure which includes the contact 11 formed in the first interlayer insulating layer 10, the contact 23 formed in the second interlayer insulating layer, and the contact 35 formed in the third and fourth interlayer insulating layers.

Figure 7:
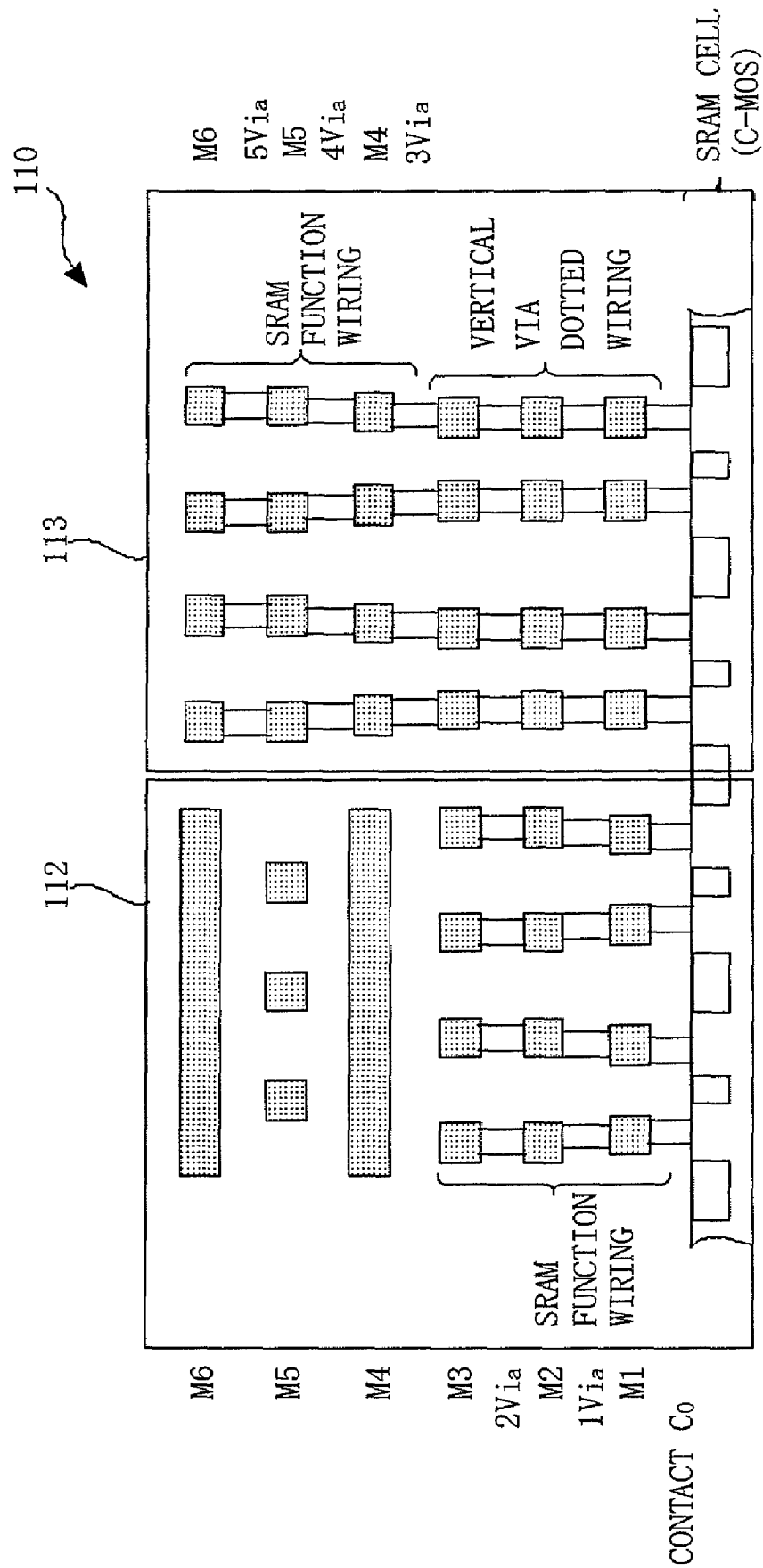
FIG. 7 is a diagram showing a semiconductor device disclosed in Harada.
Figure 8:
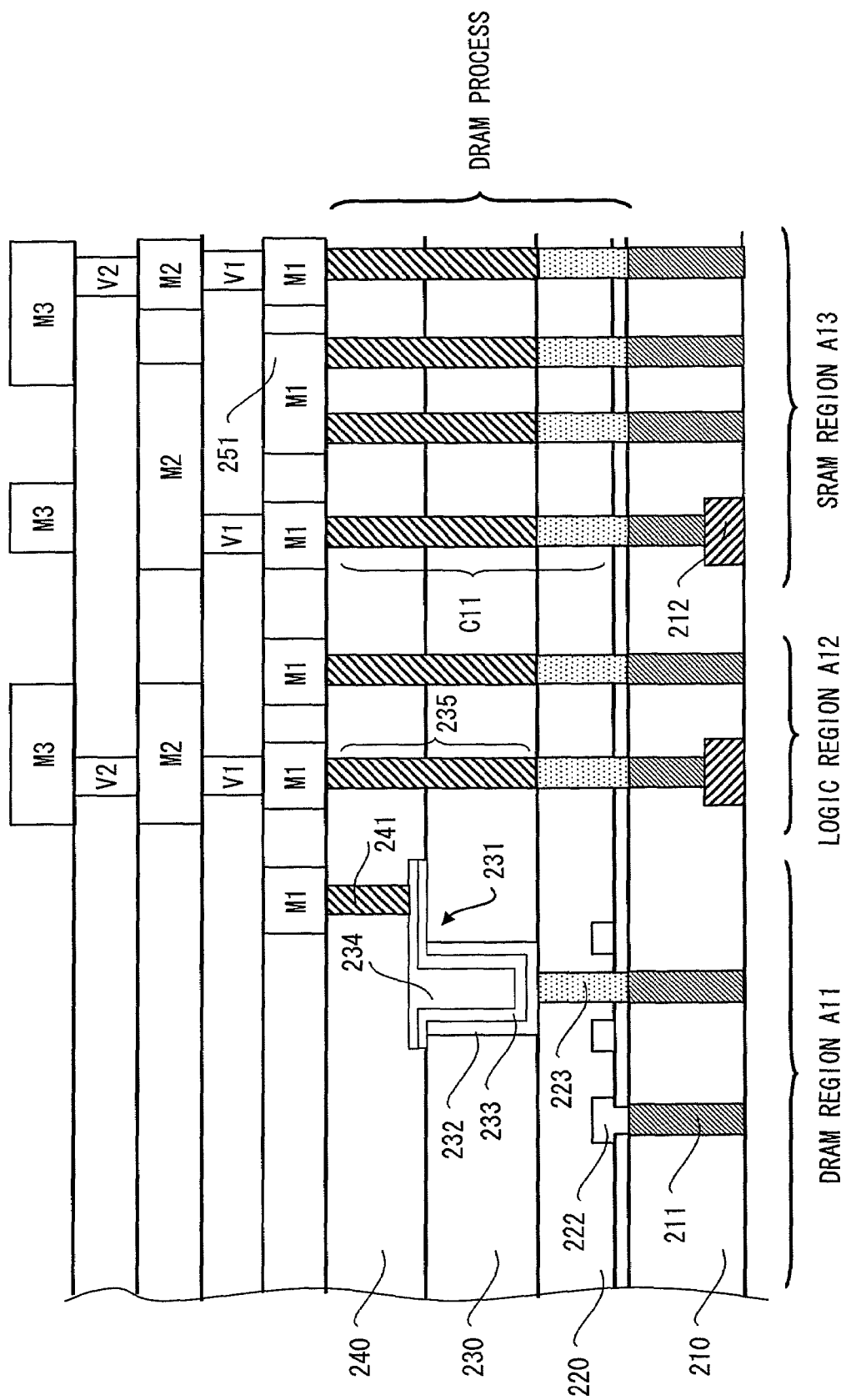
FIG. 8 is a schematic cross sectional view showing a conventional semiconductor device in which a DRAM is mixedly mounted.
Figure 11A:
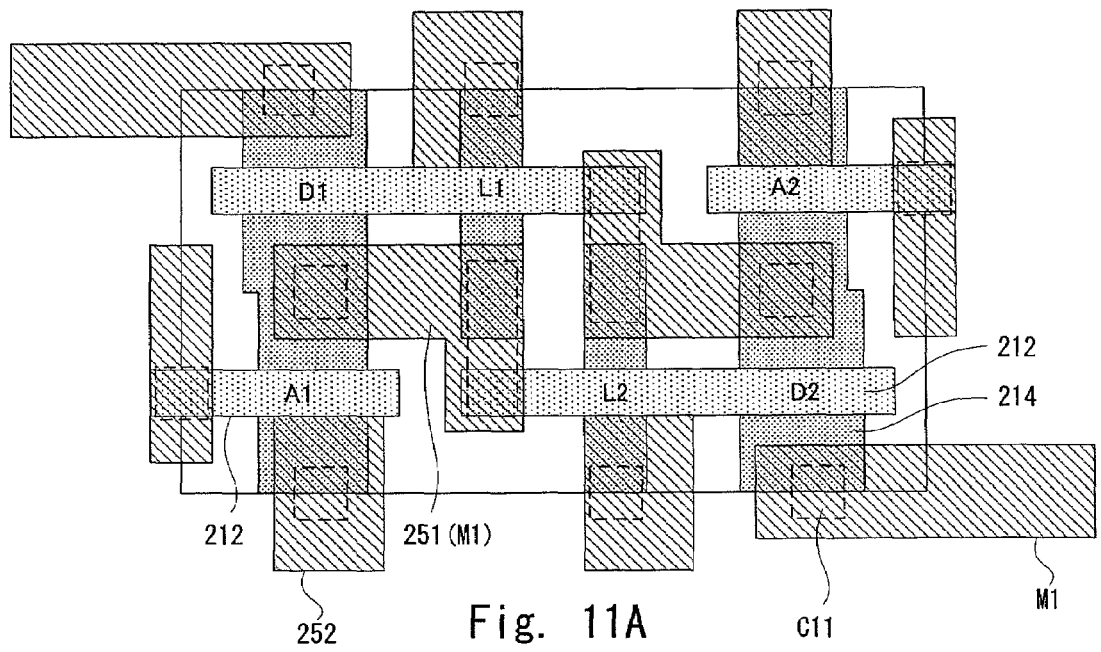
FIG. 11A is a diagram showing a conventional SRAM region and a plan view of a first wiring layer and a layer below the first wiring layer shown in FIG. 9.
Figure 11B:
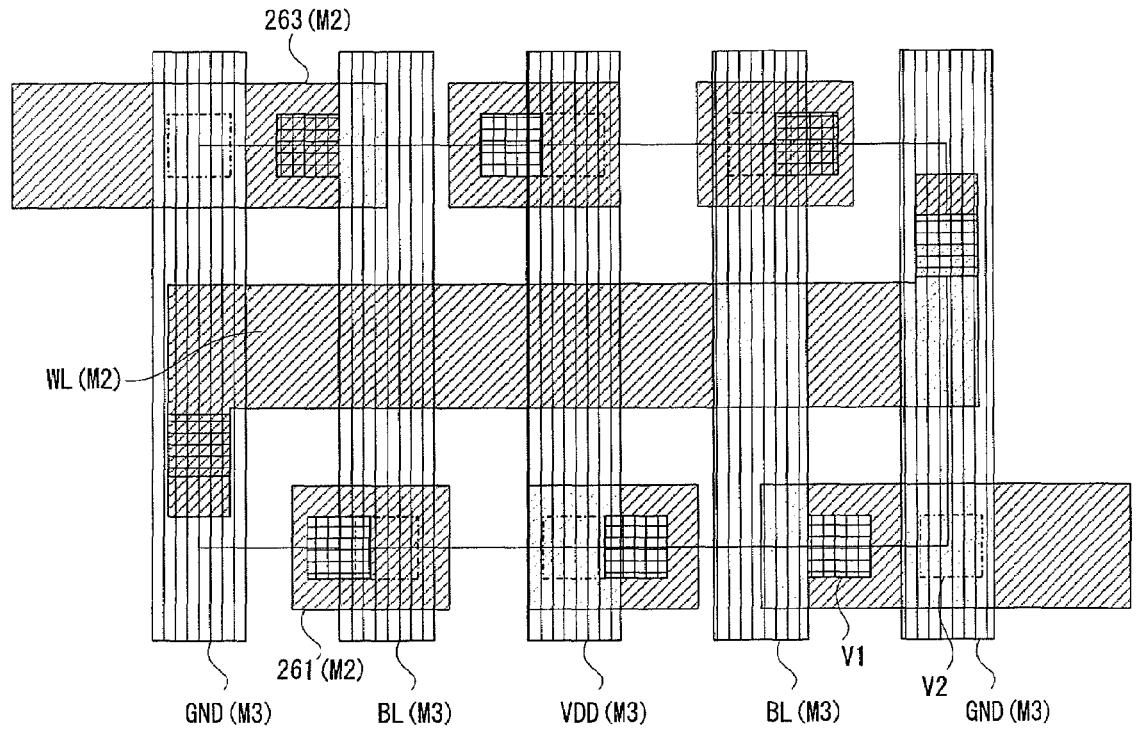
FIG. 11B is a diagram showing the conventional SRAM region and a plan view of the layer above the first wiring layer shown in FIG. 9.
Figure 12:
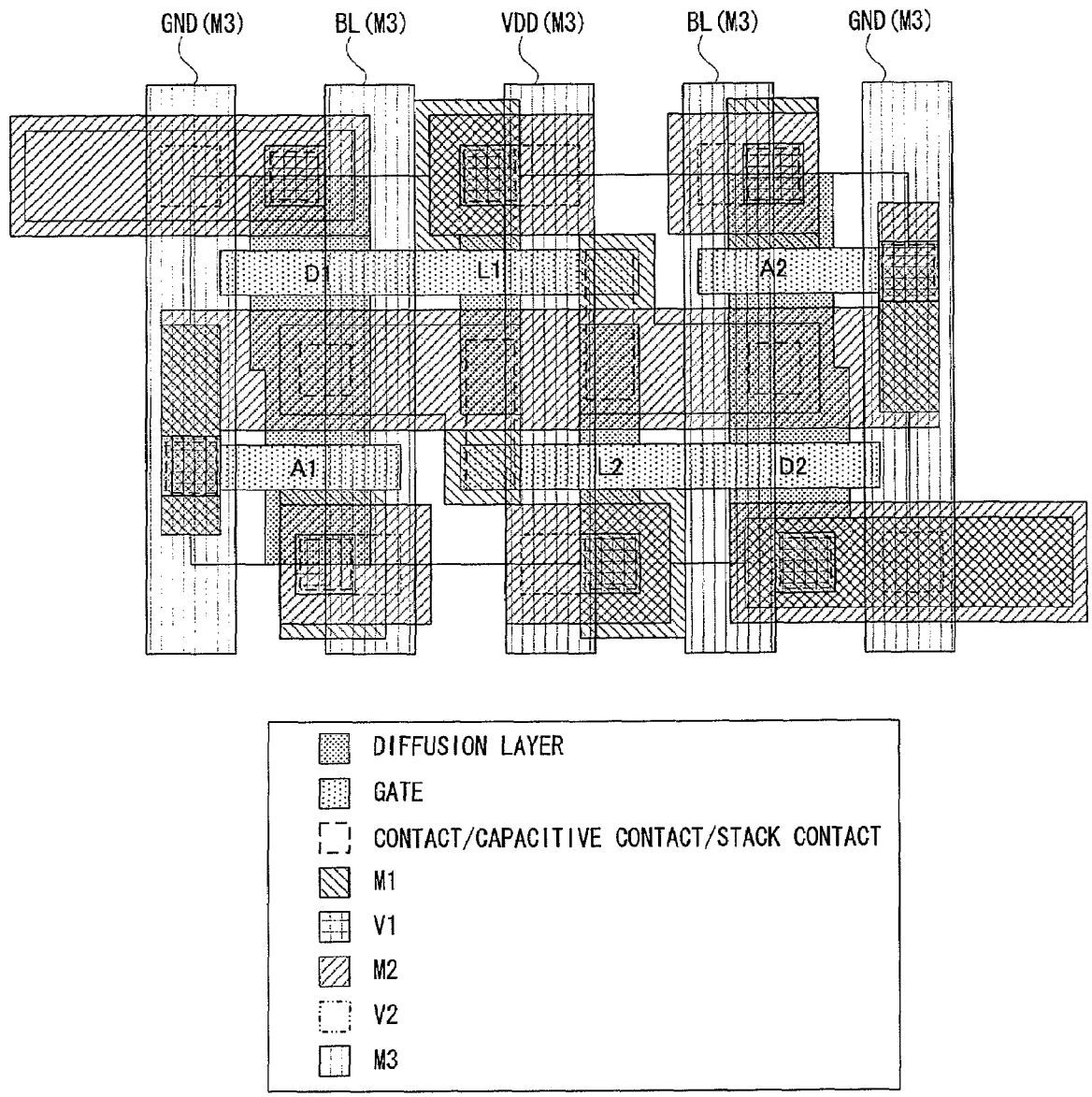
FIG. 12 is a plan view showing another conventional SRAM region.

Note that the cross couple connection (LIC: Local Inter Connect) 24 of the SRAM connecting between contacts 11 is formed in the second interlayer insulating layer in the embodiment. As shown in FIGS. 7 and 8, the cross couple connection 24 is formed in the first wiring layer M1 in the related semiconductor device.

In the present embodiment, the cross couple connection 24 is formed in the same layer as the capacitive contact 23 of the DRAM. Therefore, a wordline WL which is conventionally formed in the second wiring layer M2 can be formed in the first wiring layer M1. It is also possible to form the bitline, a ground line, and a power supply line which are formed in the third wiring layer in the related art can be formed in the second wiring layer M2 through a via V1. Note that a resistance of the cross couple connection 24 may be higher than a resistance of the first wiring layer M1 such as the wordline formed in a layer above the capacitive element 31 and the second wiring layer M2 such as the bitline, the power supply line, and the ground line.

Then, the wiring layer M3 which is formed on the second wiring layer M2 through a via V2 is different from the related one and the wiring layer M3 can freely be used. More specifically, in the related technique, one wiring layer is needed to connect between the SRAM nodes. On the other hand, in the present embodiment, the wiring layer M3 can freely be used by forming the cross couple connection in the layer below the first wiring layer M1.

As stated above, in the SRAM in the semiconductor device according to the present embodiment, the cross couple connection 24 is formed in the same layer as the capacitive contact 23 connected to the capacitive element 31 of the DRAM of the COB structure. This structure makes it possible to use the wiring layer M3 freely because there is no need to form the internodal wiring in the wiring layer above the capacitive element 31.

Figure 3A:
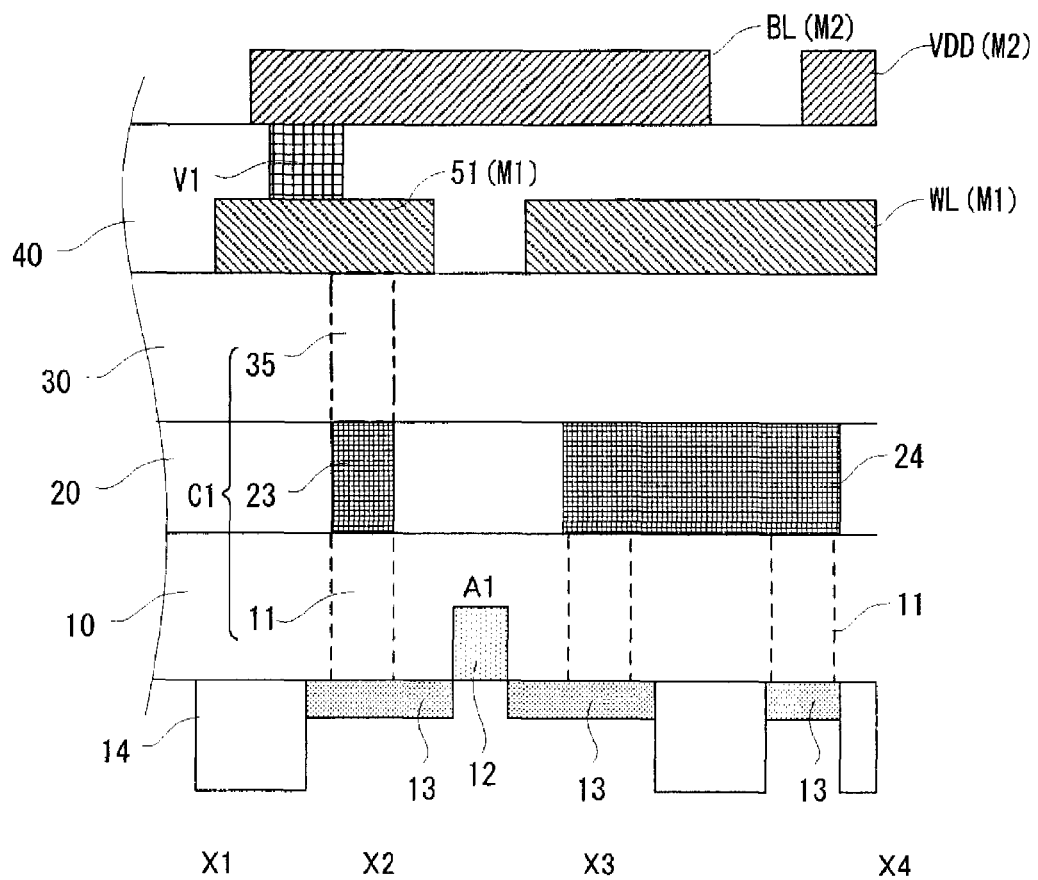
FIG. 3A is a cross sectional view showing X1 to X4 in FIG. 2.
Figure 3B:
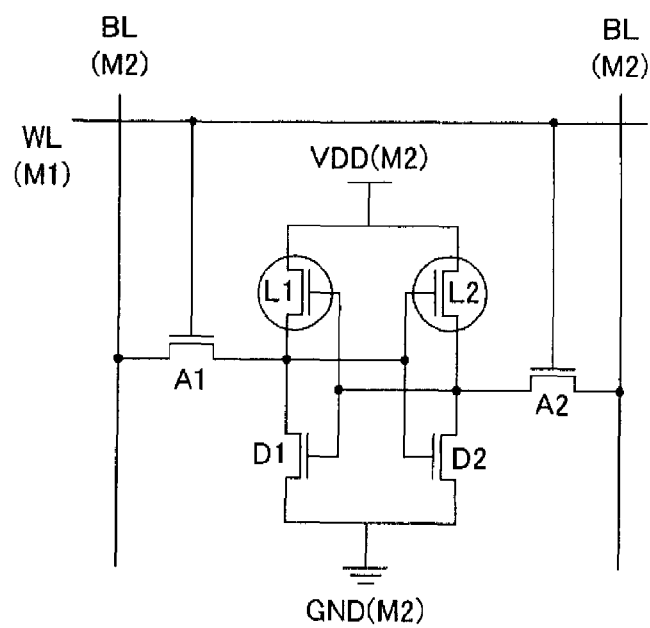
FIG. 3B is an equivalent circuit diagram of the SRAM.
Figure 4A:
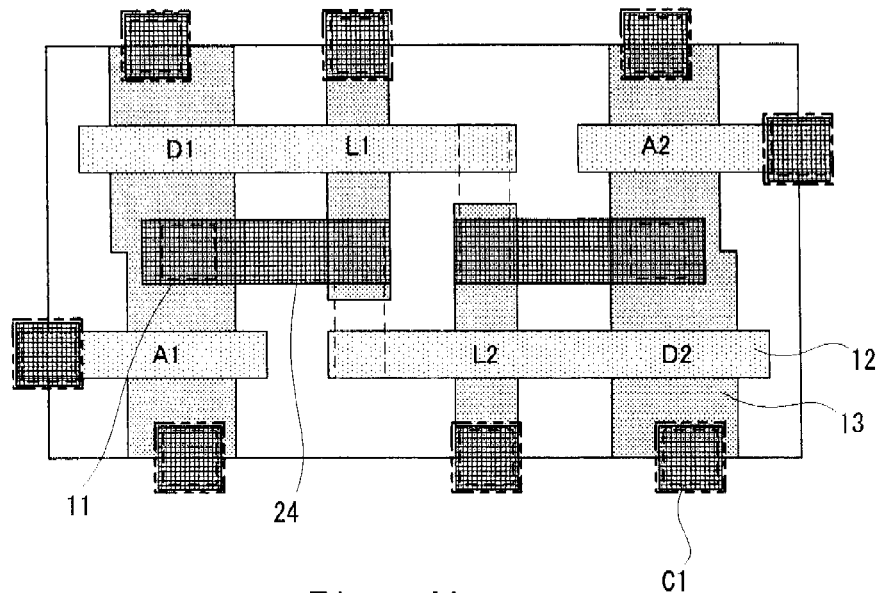
FIG. 4A is a layout diagram showing a layer below a wiring layer shown in FIG. 2.
Figure 4B:
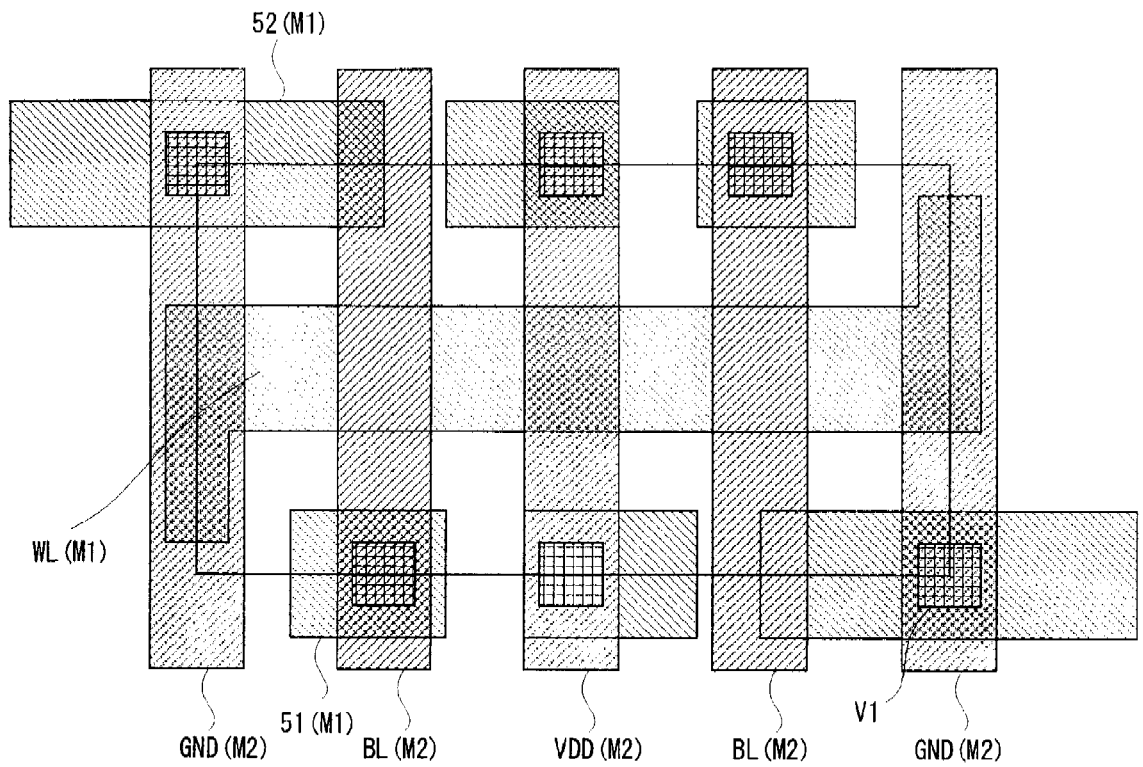
FIG. 4B is a layout diagram showing the wiring layer shown in FIG. 2.

FIG. 2 is a plan view showing a layout of the SRAM. FIG. 3A is a cross sectional view showing X1 to X4 in FIG. 2, and FIG. 3B is an equivalent circuit diagram of the SRAM. FIG. 4A is a layout diagram showing the layer below the wiring layer and shows the diffusion layer, the gate, the contact, the capacitive contact, and the stack contact. FIG. 4B is a layout diagram showing the wiring layer and shows the first wiring layer M1, the second wiring layer M2, and the via V1 connecting therebetween.

As shown in FIG. 3B, the SRAM is typically composed of six transistors. More specifically, the SRAM includes a load transistor L1 and a drive transistor D1 and a load transistor L2 and a drive transistor D2 connected between a power supply VDD and a ground GND. Each of these components builds the CMOS inverter and has inputs of inverters which are the transistors L2 and D2, outputs of inverters which are the transistors L1 and D1, and a transfer transistor (access transistor) A1 connected to a bitline BL (M3). Each of these components also has inputs of inverters which are the transistors L1 and D1, outputs of inverters which are the transistors L2 and D2, and a transfer transistor (access transistor) A2 connected to a bitline BL (M3). The gates of the transistors A1 and A2 are connected to the wordline WL and a pair of the BL (M2) performs data transferring such as reading out of/writing into the data through the transistors A1 and A2.

As stated above, in the present embodiment, the cross couple connection connecting between the diffusion layers of the transistors L1 and D1 (LIC), and the cross couple connection connecting between the diffusion layers of the transistors L2 and D2 are formed in the same layer as the capacitive contact 23 connected to the capacitive element 31. Therefore, the wiring layer which is needed in the layer above the capacitive layer 31 in the related art is not needed. Therefore, there is no need to bypass the wiring to connect between the SRAMs for example, which makes it possible to improve a freedom of the layout. So it is possible to use the third wiring layer for inter-macro connection, for example. In addition, it is possible to reduce a chip area and to reduce a number of manufacturing process.

More specifically, as shown in FIG. 3A, the cross couple connection 24 connecting a contact 11 which is connected to a common diffusion layer 13 of the transistors A1 and D1 and a contact 11 which is connected to the diffusion layer 13 of the transistor L1 is formed in the second interlayer insulating layer 20 (see FIG. 4A). In addition, the three-tiered contact C1 connected to a relay pad 51 (M1) of the first wiring layer M1 is formed by the contact 11 connected to the diffusion layer of the transistor A1, the contact which is in the same layer as the cross couple connection 24 (capacitive contact) 23, and a stack contact 35 connected to the first wiring layer M1. The contact Cl is connected to the bitline BL (M2) through the wiring 51 (M1) and the via V1. The wordline WL can be formed in the first wiring layer M1 because the cross couple connection 24 can be formed in the capacitive contact layer (see FIG. 4B).

When the SRAM is mounted on a logic process product in which the DRAM is mixedly mounted, a wiring or contact process is normally added to the general logic process to produce the product in which the DRAM is mixedly mounted. As stated above, the present invention uses this wiring or contact layer to form the cross couple connection of the SRAM cell to manufacture the SRAM.

In the typical SRAM, the first wiring layer M1 is used to connect between nodes and to form the relay pad to the upper wiring and the via V1 is used to connect the relay pad with the second wiring layer M2. On the other hand, in the logic process in which the DRAM is mixedly mounted, a process for forming the bitline and the capacitive element is added between a process for forming the contact of the general logic process and a process for forming the first wiring layer M1 in the DRAM region. And in the region other than the DRAM region, a three-tiered structure in which the capacitive contact and the stack contact are mounted on the logic contact is built to connect to the first wiring layer M1.

In the related technique, the cross couple connection is formed by the first wiring layer M1 and the first via V1.

According to the present invention, it is possible to form the cross couple connection only by the DRAM forming process in the layer below the first wiring layer M1 by forming the cross couple connection 24 of the SRAM cell and the connection part 23 with the upper layer wiring through the relay pad by using the above-described DRAM forming process.

Figure 6A:
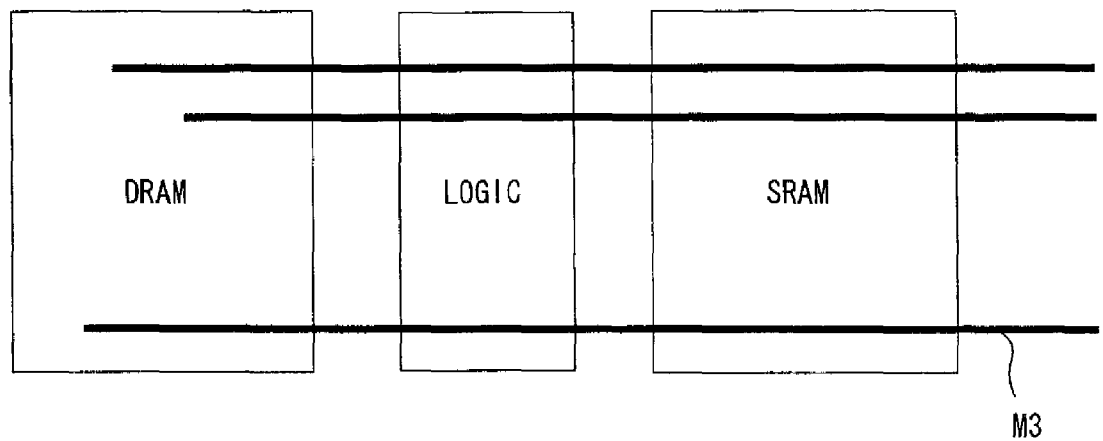
FIG. 6A is a diagram showing an effect of the semiconductor device according to the embodiment of the present invention.
Figure 6B:
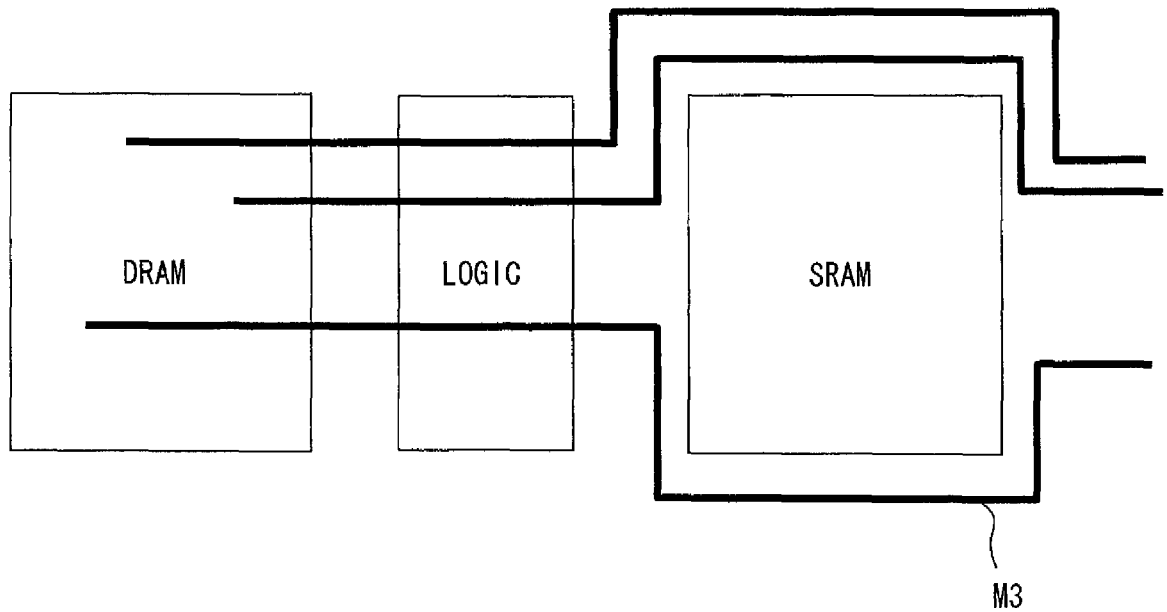
FIG. 6B is a diagram showing a semiconductor device of a related art.

The wordline WL and the bitline BL and the like which are formed in the second wiring layer M2, the second via V2, and the third wiring layer M3 in the related are formed in the present embodiment in the first wiring layer M1, the first via V1, and the second wiring layer M2 by forming the cross couple connection 24 by the DRAM forming process, which makes it possible to reduce one layer that is needed to form the SRAM. Therefore, it is possible to reduce the number of wiring layer needed for the SRAM cell, which makes it possible to pass the wiring such as the inter-macro connection on the SRAM as shown in FIG. 6A. As shown in FIG. 6A, the semiconductor device includes a DRAM macro, a SRAM macro and logic macro. In the related technique, the wiring such as the inter-macro connection bypasses the SRAM cell region as shown in FIG. 6B. Therefore, according to the present embodiment, it is possible to reduce a wiring delay, to reduce the size of the device, and to reduce the number of manufacturing process.

As stated above, it is possible to form the cross couple connection 24 by the capacitive contact 23. It is also possible to form the cross couple connection 24 by the lower electrode 32 of the capacitive element 31 or by the bitline 22. The contact part to the wiring in the upper layer through the relay pad 23 can be formed by the three-tiered contact as conventional one.

Figure 5:
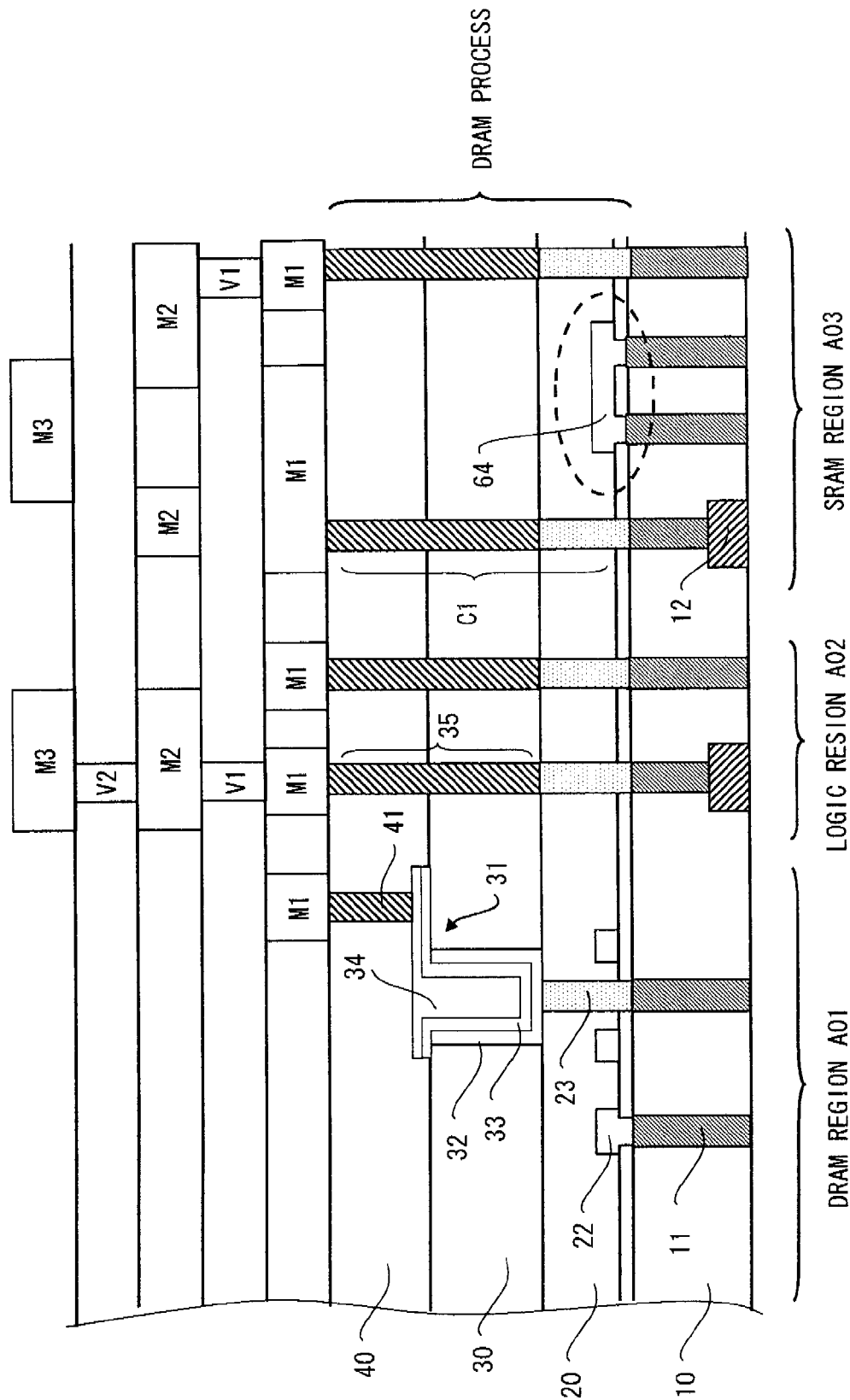
FIG. 5 is a cross sectional view schematically showing another semiconductor device according to the embodiment of the present invention.

In short, a successful outcome can be achieved when the cross couple connection of the SRAM is formed in the layer of the capacitive element or the layer below the capacitive element of the DRAM and in the layer of the bitline or the layer above the bitline. FIG. 5 is a diagram showing another example and showing when a cross couple connection 64 is formed by the bitline layer. The function wiring layer of the SRAM can be two layers, the first wiring layer M1 and the second wiring layer M2, because the cross couple connection 64 can be formed in the layer below the capacitive element 31. Therefore, as in the case stated above, it is possible to increase the freedom of the layout of the semiconductor device in which the DRAM is mixedly mounted and to reduce the size of the device.

It is apparent that the present invention is not limited to the above embodiment, but may be modified and changed without departing from the scope and spirit of the invention.

What is claimed is:

1. A semiconductor device, comprising: a substrate having a first region, a second region and a third region, a DRAM formed in the first region,
an SRAM formed in the second region, said SRAM including two access transistors,
gate electrodes of said access transistors being separated from each other, a logic formed in the third region, a first wiring layer which comprises a lowest metal layer, a first insulating layer formed on the first wiring layer, a second wiring layer formed on the first insulating layer, a second insulating layer formed on the second wiring layer, and a third wiring layer formed on the second insulating layer,
wherein said SRAM is connected to said first and second wiring layers, but not said third wiring layer, and
whereby intermacro connections between the DRAM, logic and SRAM need not bypass the second region containing the SRAM;
wherein said DRAM cell is formed on a substrate, said DRAM cell having a transistor connecting to a bit line and capacitor having a lower electrode, a dielectric film and an upper electrode; and
said SRAM cell is formed on the substrate, said SRAM cell having a cross couple connection;
wherein said cross couple connection is formed in a layer formed between said dielectric film and a layer of a plug which connects to said bit line.

2. The semiconductor device according to claim 1, wherein said cross couple connection of the SRAM cell is in the same layer as said bit line of the DRAM cell.

3. The semiconductor device according to claim 2, wherein a resistance of the cross couple connection of the SRAM cell is higher than a resistance of a metal wiring used above the upper electrode of the DRAM cell.

4. The semiconductor device according to claim 2, wherein the DRAM cell has a stack-type structure.

5. The semiconductor device according to claim 1, wherein said cross couple connection of the SRAM cell is in the same layer as a plug contact which connects to the lower electrode of the capacitance of the DRAM cell.

6. The semiconductor device according to claim 5, wherein a resistance of the cross couple connection of the SRAM cell is higher than a resistance of a metal wiring used above the upper electrode of the DRAM cell.

7. The semiconductor device according to claim 5, wherein the DRAM cell has a stack-type structure.

8. The semiconductor device according to claim 1, wherein said cross couple connection of the SRAM cell is in the same layer as the lower electrode of the capacitance of the DRAM cell.

9. The semiconductor device according to claim 8, wherein a resistance of the cross couple connection of the SRAM cell is higher than a resistance of a metal wiring used above the upper electrode of the DRAM cell.

10. The semiconductor device according to claim 8, wherein the DRAM cell has a stack-type structure.

11. The semiconductor device according to claim 1, wherein a resistance of the cross couple connection of the SRAM cell is higher than a resistance of a metal wiring used above the upper electrode of the DRAM cell.

12. The semiconductor device according to claim 1, wherein the DRAM cell has a stack-type structure.

13. The semiconductor device according to claim 1, wherein said third wiring layer is formed over said SRAM, and said third wiring layer is above the most upper layer of the SRAM.

14. The semiconductor device according to claim 1, wherein said DRAM and said logic are connected to one or more of said first wiring layer, said second wiring layer, and said third wiring layer.

15. The semiconductor device according to claim 1, further including wiring for selectively interconnecting said DRAM, said logic, and said SRAM, wherein said wiring for selectively interconnecting said DRAM, said logic, and said SRAM is located in part in said second region and forming a portion of said third wiring layer.

16. The semiconductor device according to claim 1, wherein DRAM is connected to only said first wiring layer and said logic is connected to said first wiring layer, said second wiring layer, and said third wiring layer.

* * * * *